(12) United States Patent
Aoki (10) Patent No.: US 7,504,859 B2
(45) Date of Patent: Mar. 17, 2009

(54) LEVEL CONVERTER AND SEMICONDUCTOR DEVICE

(75) Inventor: Yasushi Aoki, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 11/878,743

(22) Filed: Jul. 26, 2007

(65) Prior Publication Data
US 2008/0042725 A1 Feb. 21, 2008

(30) Foreign Application Priority Data
Aug. 18, 2006 (JP) .............................. 2006-223159

(51) Int. Cl.
*H03K 19/0175* (2006.01)
(52) U.S. Cl. .............................. 326/68; 326/81; 326/83
(58) Field of Classification Search .................. 326/62, 326/63, 68–74, 80, 81, 82, 112, 115
See application file for complete search history.

(56) References Cited

U.S. PATENT DOCUMENTS

| | | | |
|---|---|---|---|
| 5,635,859 A | 6/1997 | Yokota et al. | |
| 5,969,556 A | 10/1999 | Hayakawa | |
| 7,078,934 B2 | 7/2006 | Noguchi et al. | |
| 2001/0033186 A1 | 10/2001 | Green | |
| 2003/0234668 A1* | 12/2003 | Ilchmann | ...................... 326/66 |
| 2004/0061532 A1 | 4/2004 | Aoki | |
| 2005/0110525 A1 | 5/2005 | Chen | |

FOREIGN PATENT DOCUMENTS

| | | |
|---|---|---|
| EP | 0 536 536 A1 | 4/1993 |
| EP | 1 376 867 A1 | 1/2004 |
| JP | 6-152379 | 5/1994 |
| JP | 9-162653 | 6/1997 |
| JP | 9-261032 | 10/1997 |
| JP | 2004-128747 | 4/2004 |

OTHER PUBLICATIONS

Korean Office Action dated Sep. 30, 2008 with Japanese Translation and Partial English Translation.
European Search Report dated Nov. 5, 2008.

* cited by examiner

*Primary Examiner*—Don P Le
(74) *Attorney, Agent, or Firm*—McGinn IP Law Group, PLLC (57) ABSTRACT

A level converter includes a first to fourth transistors formed of a semiconductor having a same conductivity type. The first transistor is connected between a first power supply and a second output terminal, the second transistor is connected between a second power supply and a first output terminal, the third transistor is connected between the first power supply and the first output terminal, the fourth transistor is connected between the second power supply and the second output terminal, the first and the second transistors are input with one of first differential signals and the third and the fourth transistors are input with another of the first differential signals.

20 Claims, 11 Drawing Sheets

RELATED ART

Fig. 14

RELATED ART

LEVEL CONVERTER AND SEMICONDUCTOR DEVICE

BACKGROUND OF THE INVENTION

1. Field of the Invention

The present invention relates to a level converter and a semiconductor device, and particularly to a level converter and a semiconductor device for suppressing an attenuation of a signal communicated across wide band.

2. Description of Related Art

In recent years, an operating speed of a semiconductor device is increasing. Thus a frequency of a signal transmitted and received between semiconductor devices is increasing. To transmit/receive such a high frequency signal, generally an amplitude of the signal is reduced and the signal is treated as a differential signal. By reducing the amplitude of the signal, it is possible to generate a signal that changes at high speed without increasing the current driving capability of output buffer. Furthermore, by treating the signal as a differential signal, it is possible to improve noise immunity of a small amplitude signal. For such a small amplitude signal, there is a CML (Current Mode Logic) level signal having a smaller amplitude than the voltages such as a power supply voltage and ground voltage. On the other hand, a signal having a large amplitude from the ground voltage to power supply voltage is referred to as a CMOS (Complementary Metal Oxide Semiconductor) level signal.

Figure 12:
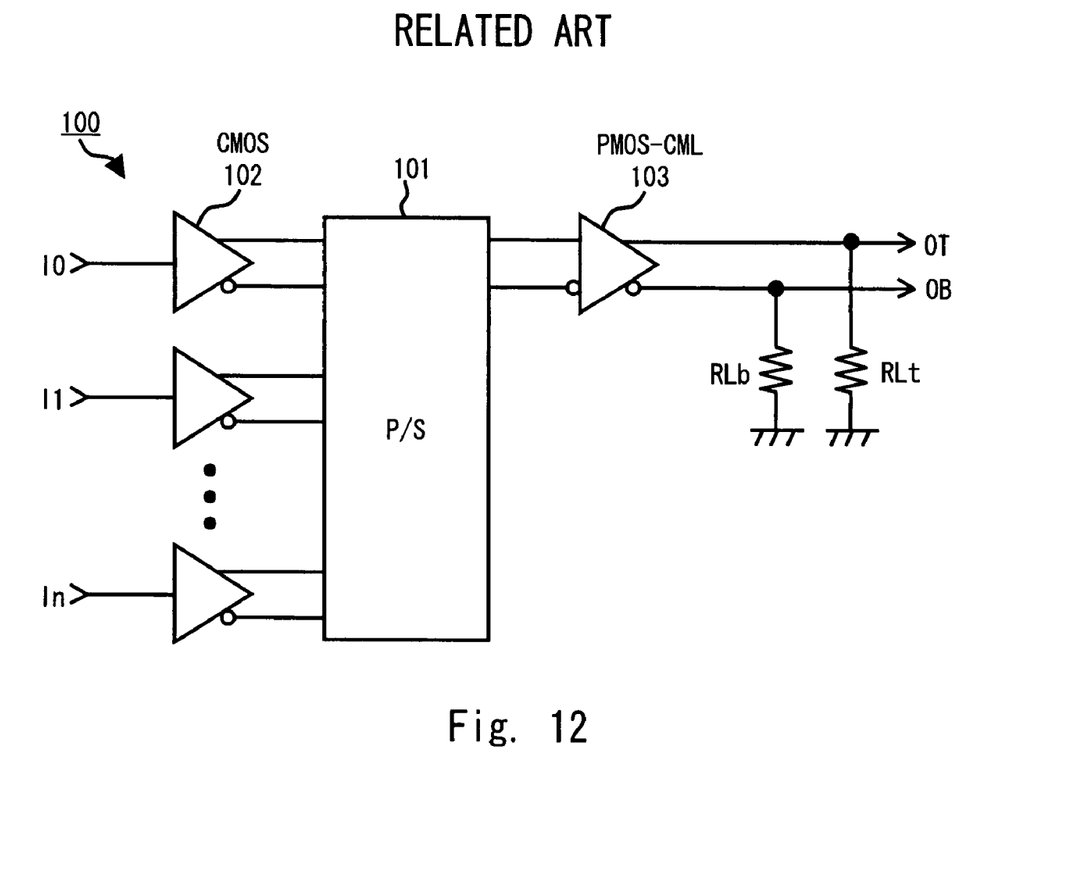
FIG. 12 is a block diagram of a conventional transmitting circuit.
Figure 13:
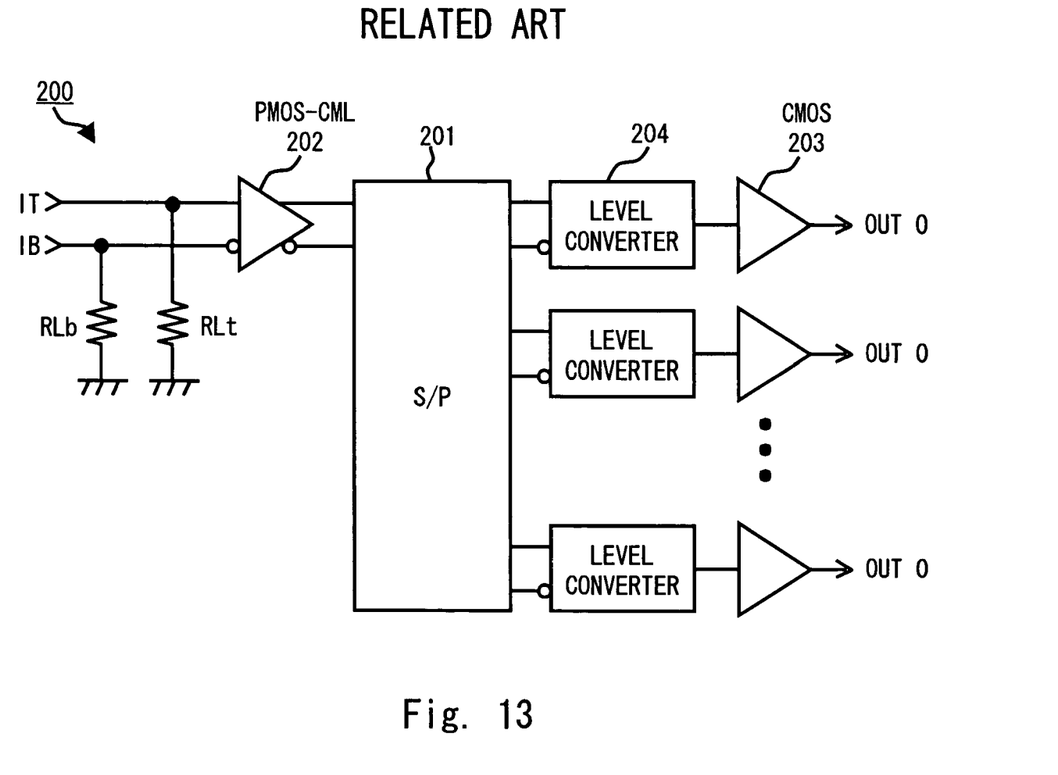
FIG. 13 is a block diagram of a conventional receiving circuit.

An example of a circuit processing a CML level signal is shown in FIGS. 12 and 13. FIG. 12 shows a transmitting circuit 100. The transmitting circuit 100 is a circuit for transmitting a CML level signal and converts a CMOS level signal input in parallel to a CML level signal output in serial. Here, the CML level signal performs a differential operation and a central voltage of the amplitude is close to the ground voltage. This signal is referred to as a PMOS-CML level signal. On the other hand, a signal that performs a differential operation and a central voltage of the amplitude is close to the power supply voltage is referred to as a NMOS-CML level signal.

The transmitting circuit 100 includes a parallel to serial converter 101, CMOS amplifier 102 and PMOS-CML amplifier 103. The CMOS amplifier 102 is composed of CMOS transistors. Furthermore, the CMOS amplifier 102 generates a differential signal having a CMOS level from a single-end signal having a CMOS level and then outputs the signal. The parallel to serial converter 101 converts a parallel signal input from the CMOS amplifier 102 into a serial signal and then outputs the signal. At this time, the parallel to serial converter 101 converts a CMOS level signal into a PMOS-CML level signal. Therefore, in order to generate a PMOS-CML level signal, the parallel to serial converter 101 has the PMOS-CML amplifier that includes a differential pair composed of PMOS transistors. The PMOS-CML amplifier 103 is an amplifier having a differential pair composed of PMOS transistors. Moreover, the PMOS-CML amplifier 103 matches an output impedance with load resistances RLt and RLb that are connected to an output of the PMOS-CML amplifier and outputs a PMOS-CML level signal. The PMOS-CML level signal to be output is generated based on an output from the parallel to serial converter 101.

On the other hand, the receiving circuit 200 of FIG. 13 receives a CML level signal and converts the CML level signal input in serial to a CMOS level signal output in parallel. Here, this CML level signal is a PMOS-CML level signal.

Figure 14:
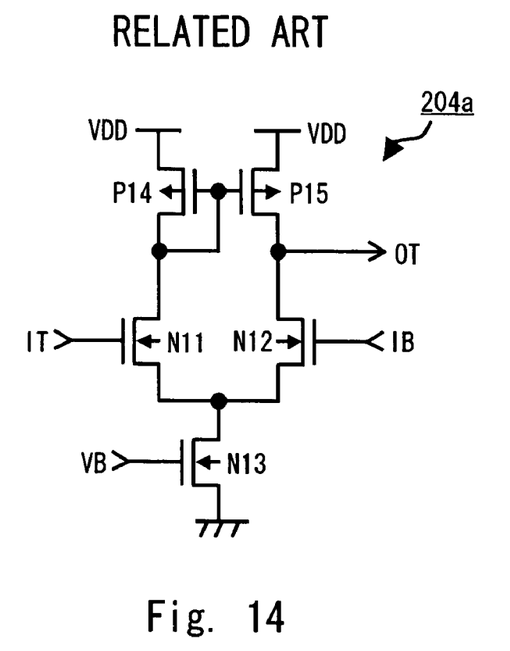
FIG. 14 is an example of a circuit diagram of a conventional level converter.
Figure 15:
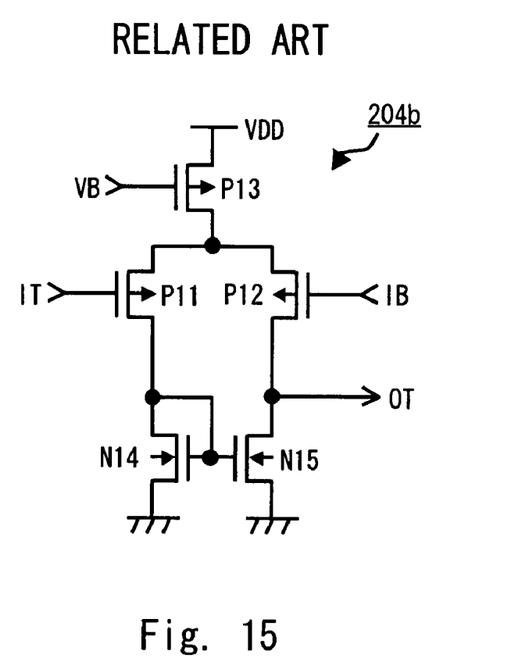
FIG. 15 is an example of a circuit diagram of a conventional level converter.

The receiving circuit 200 includes a serial to parallel converter 201, PMOS-CML amplifier 202, CMOS amplifier 203 and level converters 204. The PMOS-CML amplifier 202 has a differential pair composed of PMOS transistors. The PMOS-CML amplifier 202 operates as an input buffer for receiving a PMOS-CML level signal. The serial to parallel converter 201 converts a serial signal input from the PMOS-CML amplifier 202 into a parallel signal and then outputs the signal. The serial to parallel converter 201 includes a PMOS-CML amplifier having a differential pair composed of PMOS transistors so as to handle PMOS-CML level signals. The level converters 204 are differential amplifiers as shown in FIGS. 14 and 15, for example, that convert a signal input at a CML level into a signal of a CMOS level. Another example of the level converter 204 is disclosed in Japanese Unexamined Patent Application Publication No. 6-152379, 9-261032 and 2004-128747. The CMOS amplifier 203 is composed of CMOS transistors.

To process a CML level signal having a level close to the ground potential, an amplifier having a differential pair composed of NMOS transistors cannot be used. This is because that for such a low level signal, a gate voltage of the NMOS transistors does not exceed the threshold voltage. Therefore, to process such a low signal level differential signal, the differential pair must be composed of PMOS transistors.

However, it is generally known that as PMOS transistors have carrier mobility lower than NMOS transistors, a frequency of signal that can be communicated is poorer than NMOS transistors. Therefore, we have now discovered that to process a CML level signal having a low signal level, there is a problem that a signal with high frequency cannot be communicated by a circuit using the abovementioned PMOS-CML amplifier.

SUMMARY

In one embodiment, a level converter includes a first to fourth transistors formed of a semiconductor having a same conductivity type. The first transistor is connected between a first power supply and a second output terminal, the second transistor is connected between a second power supply and a first output terminal, the third transistor is connected between the first power supply and the first output terminal, the fourth transistor is connected between the second power supply and the second output terminal, the first and the second transistors are input with one of first differential signals and the third and the fourth transistors are input with another of the first differential signals.

In another embodiment, a level converter includes a first to fourth transistors formed of a semiconductor having a same conductivity type, a first source follower including the first transistor having a source connected to a first power supply and a drain connected to a second output terminal and the fourth transistor having a drain connected to a second power supply and a source connected to the second output terminal and a second source follower including the third transistor having a source connected to the first power supply and a drain connected to a first output terminal and the second transistor having a drain connected to the second power supply and a source connected to the first output terminal. One of first differential signals is input to the first and the second transistors and another of the first differential signals is input to the third and the fourth transistors.

According to the level converter of the present invention, the first and the third transistors operate as current sources for the source followers. Furthermore, an amplitude of an output signal is configured according to a ratio between resistances generated in the first and fourth transistors. That is, it is possible to reduce the resistance values of transistors while maintaining the resistance ratio between the first and fourth transistor and a resistance ratio between the second and the third transistor to be constant. Thus, frequency characteristic can be improved by increasing the amount of current supplied to the second and the fourth transistors operating as amplifier stages for the source followers so as to increase the carrier mobility of the transistors. Moreover, the amplitude of the output signal can be increased.

In another embodiment, a semiconductor device includes a first level converter to convert a differential input signal into a first differential signal having a first signal level, a second level converter to convert a differential input signal into a second differential signal having a second signal level, a third level converter to convert the first differential signal into the second differential signal. The third level converter is connected between the first level converter and the second level converter.

According to the semiconductor device of the present invention, when the first differential signal is a NMOS-CML level signal and the second differential signal is a PMOS-CML level signal, the NMOS-CML level signal can be converted into the PMOS-CML level signal by the third level converter. Therefore, according to the semiconductor device of the present invention, a NMOS-CML amplifier having excellent frequency characteristic is used as the first level converter and a PMOS-CML amplifier having poor frequency characteristic is used as the second level converter. By this, the PMOS-CML level signal can be communicated in a wide band without attenuating an amplitude.

Note that the first differential signal may be a PMOS-CML level signal and the second differential signal may be a NMOS-CML level signal. At this time, the first level converter uses the PMOS-CML amplifier and the second level converter uses the NMOS-CML amplifier.

According to the level converter and semiconductor device of the present invention, the deterioration of frequency characteristics by the characteristic of the transistor can be improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAIL DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
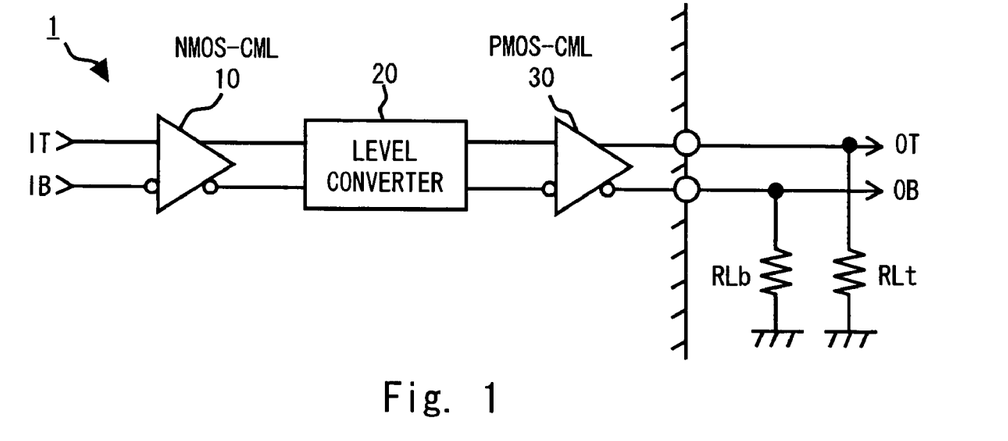
FIG. 1 is a block diagram of a transmitting circuit according to a first embodiment of the present invention.

In a first embodiment, a case is described in which a circuit of the present invention is used for a transmitting circuit of a semiconductor device. A block diagram of a transmitting circuit 1 according to a first embodiment is illustrated in FIG. 1. As shown in FIG. 1, the transmitting circuit 1 includes a NMOS-CML amplifier 10, level converter 20 and PMOS-CML amplifier 30. In the first embodiment, the NMOS-CML amplifier 10 is used as a first level converter, PMOS-CML amplifier 30 is used as a second level converter and the level converter 20 is used as a third level converter. Note that a semiconductor device has circuits (not shown) for processing other signal processes in addition to the transmitting circuit 1. Furthermore, differential signals (IT and IB in FIG. 1) input to the NMOS-CML amplifier 10 are generated by those circuits.

The NMOS-CML amplifier 10 converts a signal level of the differential input signals IT and IB into a first signal level (for example NMOS-CML level) to output a first differential signal. In this embodiment, a signal level of the differential input signals is a CMOS or NMOS-CML level. The level converter 20 converts a signal level of the first differential signal having the first signal level into a second signal level (for example PMOS-CML level) to output a second differential signal. The PMOS-CML amplifier 30 operates as an output buffer of the semiconductor device. More specifically, the PMOS-CML amplifier 30 receives the second differential signal and outputs the received second differential signal as differential output signals OT and OB. At this time, an output impedance of the PMOS-CML amplifier 30 is configured so that impedances of the externally connected load resistances RLt and RLb become the same. This condition is referred to as impedance matched. In FIG. 1, the load resistances RLt and RLb are connected outside the semiconductor device, however they may be mounted inside the semiconductor device.

A CML level signal is described hereinafter. The CML level signal has an amplitude smaller than a CMOS level signal having an amplitude from the ground voltage to power supply voltage. For example when the ground voltage is VSS and power supply voltage is VDD, the CML level signal has an amplitude half of the power supply voltage. In this embodiment, a CML level signal having a signal level close to the power supply voltage (for example an amplitude and signal level from VDD/2 to VDD) is referred to as a NMOS-CML level signal. A CML level signal having a signal level close to the ground voltage (for example an amplitude and signal level from VSS to VDD/2) is referred to as a PMOS-CML level signal. Note that the amplitude and signal level for the CML level signal are not limited to the abovementioned case but may be an amplitude of approx. 0.1V, for example.

Figure 2:
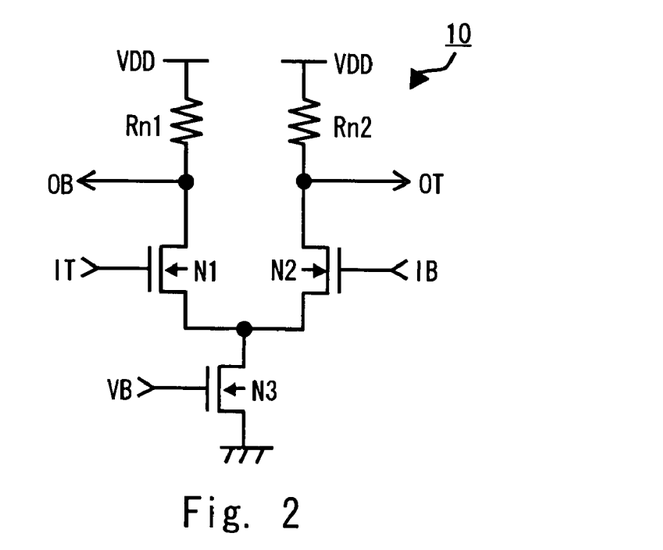
FIG. 2 is a circuit diagram of a NMOS-CML amplifier according to the first embodiment of the present invention.

Here, the NMOS-CML amplifier 10, level converter 20 and PMOS-CML amplifier 30 are described hereinafter in more detail. FIG. 2 shows a circuit diagram of the NMOS-CML amplifier 10. The NMOS-CML amplifier 10 includes a differential pair composed of NMOS transistors so as to enable inputting a NMOS-CML level signal. As shown in FIG. 2, the NMOS-CML amplifier 10 includes NMOS transistors N1 to N3 and resistances Rn1 and Rn2. The NMOS transistors N1 and N2 constitute the differential pair. To a gate of the NMOS transistor N1, one of the differential signals among differential input signals (for example the differential signal IT) is input. To a gate of the NMOS transistor N2, another differential signal among the differential input signals (for example the differential signal IB) is input. These differential signals IT and IB are signals inverted to each other.

Furthermore, sources of the NMOS transistors N1 and N2 are connected in common. The NMOS transistor N3 is connected between the common connection point and a first power supply (for example ground voltage). The NMOS transistor N3 supplies a current to the differential pair, where the current corresponds to the voltage value of a bias voltage VB that is applied to a gate. The resistance Rn1 is connected between a drain of the NMOS transistor N1 and a second power supply (for example power supply voltage). Moreover, one of the differential signal OB among the differential output signals output from the NMOS-CML amplifier 10 is output from the connection point of the NMOS transistor N1 and resistance Rn1. The resistance Rn2 is connected between a drain of the NMOS transistor N2 and the power supply voltage. Furthermore, another differential signal OT among the differential output signals output from the NMOS-CML amplifier 10 is output from the connection point of the NMOS transistor N2 and resistance Rn2. Signal levels of the differential signals OB and OT output from the NMOS-CML amplifier 10 are NMOS-CML level. Amplitudes of the differential signals OB and OT output from the NMOS-CML amplifier 10 are configured by resistance values of the resistances Rn1 and Rn2 and current flowing to each of the resistances.

Figure 3:
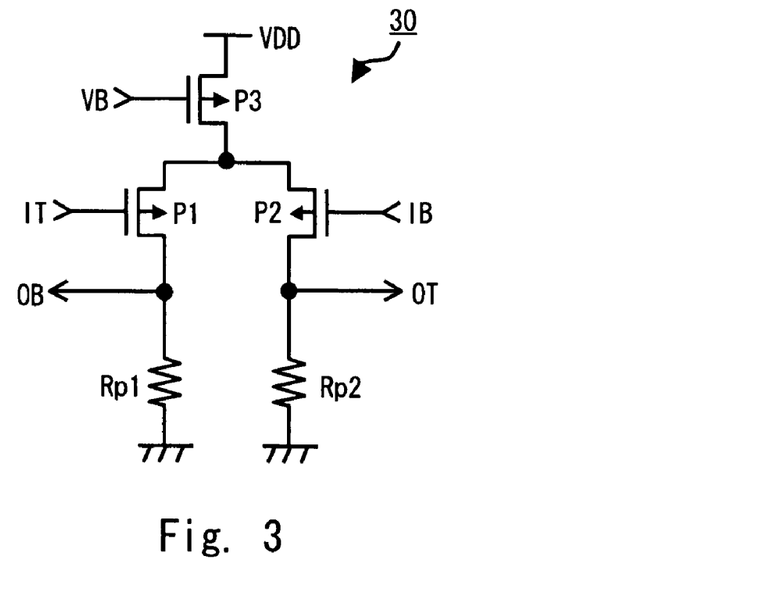
FIG. 3 is a circuit diagram of a PMOS-CML amplifier according to the first embodiment of the present invention.

FIG. 3 is a circuit diagram of the PMOS-CML amplifier 30. The PMOS-CML amplifier 30 includes a differential pair composed of PMOS transistors so as to enable inputting a PMOS-CML level signal. As shown in FIG. 3, the PMOS-CML amplifier 30 includes PMOS transistors P1 to P3 and resistances Rp1 and Rp2. The PMOS transistors P1 and P2 constitute the differential pair. To a gate of the PMOS transistor P1, one of the differential signals among differential input signals (for example the differential signal IT) is input. To a gate of the PMOS transistor P2, another differential signal among the differential input signals (for example the differential signal IB) is input. These differential signals IT and IB are signals inverted to each other.

Furthermore, sources of the PMOS transistors P1 and P2 are connected in common. The PMOS transistor P3 is connected between the common connection point and the power supply voltage. The PMOS transistor P3 supplies a current to the differential pair, where the current corresponds to the voltage value of the bias voltage VB that is applied to a gate. The resistance Rp1 is connected between a drain of the PMOS transistor P1 and the ground voltage. Moreover, one of the differential signal OB among the differential output signals output from the PMOS-CML amplifier 30 is output from the connection point of the PMOS transistor P1 and resistance Rp1. The resistance Rp2 is connected between a drain of the PMOS transistor P2 and the ground voltage. Furthermore, another differential signal OT among the differential output signals output from the PMOS-CML amplifier 30 is output from the connection point of the PMOS transistor P2 and resistance Rp2. Signal levels of the differential signals OB and OT output from the PMOS-CML amplifier 30 are PMOS-CML level. Amplitudes of the differential signals OB and OT output from the PMOS-CML amplifier 30 are configured by resistance values of the resistances Rp1 and Rp2 and currents flowing to each of the resistances.

Figure 4:
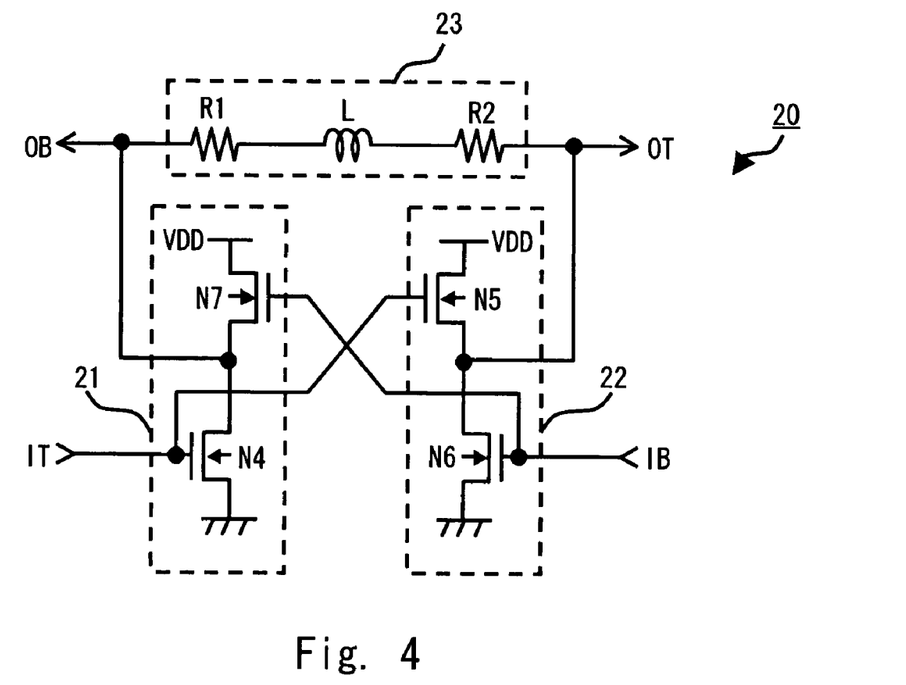
FIG. 4 is a circuit diagram of a level converter according to the first embodiment of the present invention.

FIG. 4 is a circuit diagram of the level converter 20. The level converter 20 of this embodiment is composed of the NMOS transistors so as to input a first differential signal (for example a NMOS-CML level differential signal) and output a second differential signal (for example a PMOS-CML level differential signal). As shown in FIG. 4, the level converter 20 includes a first source follower 21, second source follower 22 and frequency characteristic adjusting circuit 23.

The first source follower 21 includes a first transistor (for example a NMOS transistor N4) and fourth transistor (for example NMOS transistor N7). As for the NMOS transistor N4, a source is connected to the ground voltage and a drain is connected to a second output terminal. As for the NMOS transistor N7, a drain is connected to the power supply voltage and a source is connected to the second output terminal. To a gate of the NMOS transistor N4, one of the differential signal (for example the differential input signal IT) among the first differential signals is input. To a gate of the NMOS transistor N7, another differential signal (for example the differential input signal IB) among the first differential signals is input. One of the differential signal OB among the second differential signals is output from the second output terminal.

Moreover, the NMOS transistor N4 operates as a current source for the first source follower 21. On the other hand, the NMOS transistor N7 operates as an amplifier stage for the first source follower 21. An amplitude and signal level of the differential signal OB are configured according to a ratio between resistance values generated in the NMOS transistors N4 and N7. Furthermore, a current flowing to the NMOS transistor N7 is configured according to the power supply voltage and the sum of resistance values generated in the NMOS transistors N4 and N7. That is, by reducing the resistance values generated in the transistors, the amount of current flowing to the NMOS transistor N7 can be increased. At this time, a ratio of the resistance values generated in the NMOS transistors N4 and N7 is configured so that the amplitude of the differential signal OB becomes certain size.

The second source follower 22 includes a second transistor (for example NMOS transistor N5) and a third transistor (for example NMOS transistor N6). As for the NMOS transistor N6, a source is connected to the ground voltage and a drain is connected to a first output terminal. As for the NMOS transistor N5, a drain is connected to the power supply voltage and a source is connected to the first output terminal. To a gate of the NMOS transistor N5, the differential input signal IT among the first differential signal is input. To a gate of the NMOS transistor N6, the differential input signal IB among the first differential signal is input. Another differential signal OT among the second differential signal is output from the first output terminal.

Moreover, the NMOS transistor N6 operates as a current source for the second source follower 22. On the other hand, the NMOS transistor N5 operates as an amplifier stage for the second source follower 22. An amplitude and signal level of the differential signal OT are configured according to a ratio between resistance values generated in the NMOS transistors N5 and N6. Furthermore, a current flowing to the NMOS transistor N5 operating as the amplifier stage is configured according to the power supply voltage and the sum of resistance values generated in the NMOS transistors N5 and N6. That is, by reducing the resistance values generated in the transistors, the amount of current flowing to the NMOS transistor N5 can be increased. At this time, a ratio of the resistance values generated in the NMOS transistors N5 and N6 is configured so that the amplitude of the differential signal OB becomes certain size.

The frequency characteristic adjusting circuit 23 is connected between the first and the second output terminals. The frequency characteristic adjusting circuit 23 includes resistances R1 and R2 and an inductor L. In an example of FIG. 4, the resistances R1 and R2 are placed to the both ends of the inductor L and the resistances R1 and R2 and inductor L are connected in series. The frequency characteristic adjusting circuit 23 forms a filter by these resistances, inductor and drain and gate capacity of the transistors connected to the first and second output terminals so as to adjust frequency characteristic near a cutoff frequency of a signal to be communicated. Note that the frequency characteristic indicates a change in a signal amplitude to an increase of signal frequency. In the explanation below, a transistor capable of maintaining an amplitude of a signal to higher frequency is referred to as a transistor with excellent frequency characteristic.

Figure 5:
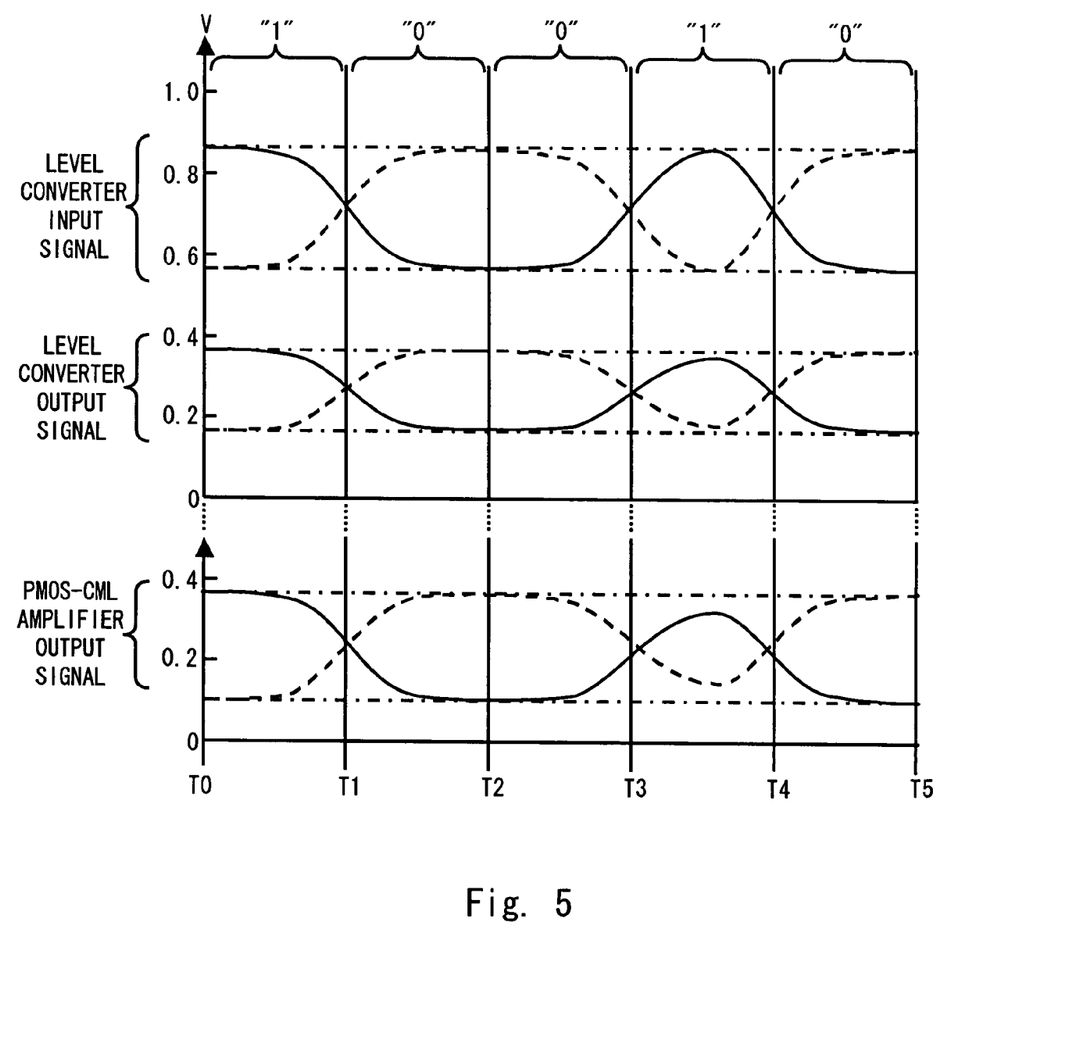
FIG. 5 shows signal waveforms under a first condition of the transmitting circuit according to the first embodiment of the present invention.
Figure 6:
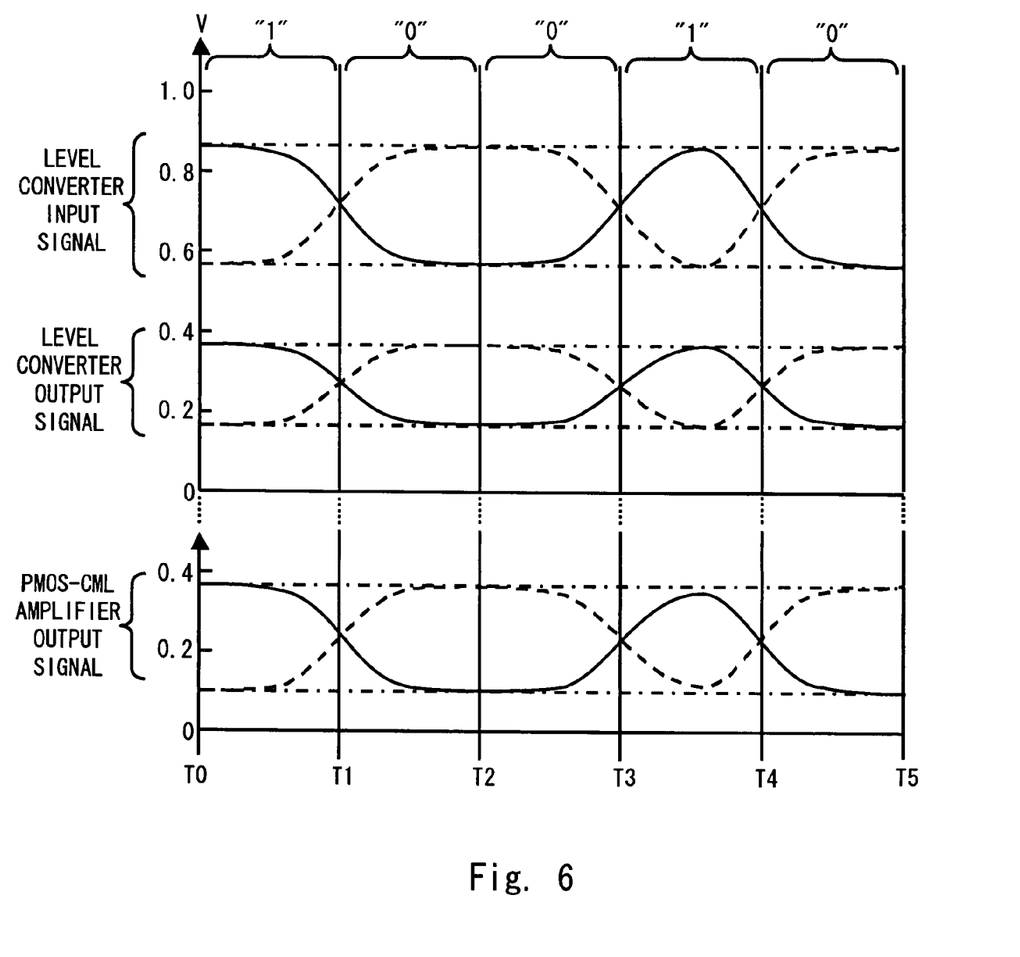
FIG. 6 shows signal waveforms under a second condition of the transmitting circuit according to the first embodiment of the present invention.
Figure 7:
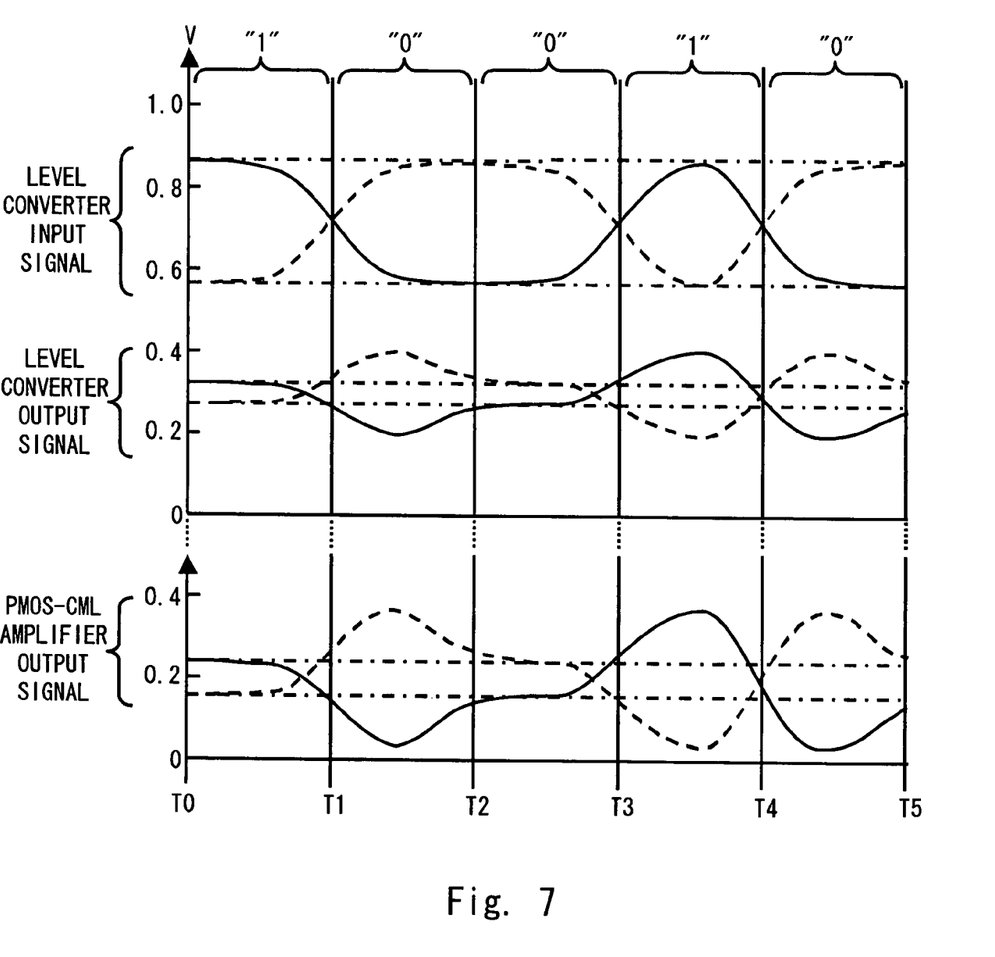
FIG. 7 shows signal waveforms under a third condition of the transmitting circuit according to the first embodiment of the present invention.

Note that in light of frequency characteristic of the entire circuit, the frequency characteristic adjusting circuit 23 may not be inserted. Furthermore, in an example of FIG. 4, the resistances and inductor are included but it may be either one of these. A case is described hereinafter in which the characteristic of the frequency characteristic adjusting circuit 23 is changed. FIGS. 5 to 7 show waveforms of a signal communicated when changing the characteristic of the frequency characteristic adjusting circuit 23.

An example of FIG. 5 is waveforms of a signal communicated under a first condition where the frequency characteristic adjusting circuit 23 is not connected. The upper waveforms shown in FIG. 5 are waveforms of an input signal for the level converter 20 and middle waveforms are waveforms of an output signal for the level converter 20. Moreover, the lower waveforms are waveforms of an output signal for the PMOS-CML amplifier 30.

As shown in FIG. 5, in this case the level converter 20 converts a signal level of the input signal from the NMOS-CML level to PMOS-CML level. At this time, an amplitude of the signal is reduced slightly. An amplitude of the output signal from the level converter 20 is configured according to a ratio of the resistance values generated in the NMOS transistors that are connected in series. Furthermore, in the period from timing T2 to T5, the input signal changes as "0" "1" "0". However, an attenuation of the signal level of the output signal in the period from T3 to T4 is larger than other period. This depends on the frequency characteristics of the transistors. More specifically, as the frequency of the signal to be communicated is near a boundary of a band for a signal that can be communicated by the NMOS transistors N4 to N7, a slew rate of the transistors cannot follow changes in the signal.

Furthermore, a signal level of an output signal from the PMOS-CML amplifier 30 is substantially the same as a signal level of an output signal from the level converter 20. Moreover, the attenuation of the signal in the period from timing T3 to T4 is larger than the output signal from the level converter 20. This depends on the frequency characteristics of the PMOS transistors P1 and P2.

An example of FIG. 6 is waveforms of a signal communicated under a second condition where the frequency characteristic adjusting circuit 23 is connected. The upper waveforms shown in FIG. 6 are waveforms of an input signal for the level converter 20 and middle waveforms are waveforms of an output signal for the level converter 20. Moreover, the lower waveforms are waveforms of an output signal for the PMOS-CML amplifier 30.

As shown in FIG. 6, in this case the level converter 20 converts a signal level of the input signal from the NMOS-CML level to PMOS-CML level. At this time, an amplitude of the signal is reduced slightly. An amplitude of the output signal from the level converter 20 is configured according to a ratio of the resistance values generated in the NMOS transistors that are connected in series and values of the resistances R1 and R2 in the frequency characteristic adjusting circuit 23. Furthermore, in the period from timing T2 to T5, the input signal changes as "0" "1" "0". However, an attenuation of the signal level of the output signal in the period from T3 to T4 is slightly larger than other period. This is because that to complement the attenuation of the amplitude by frequency characteristics of the transistors, the frequency characteristic adjusting circuit 23 corrects the frequency characteristics of the transistors. That is, the frequency characteristic adjusting circuit 23 corrects this attenuation by emphasizing the frequency characteristic near the cutoff frequency where the amplitude of the output signal from the level converter 20 is attenuated. Note that the degree of the correction is configured by the values of the resistances R1 and R2 and inductor L in the frequency characteristic adjusting circuit 23, diffusion layer capacities of the NMOS transistors N5 and N7 and gate capacities of the PMOS transistors P1 and P2 in the PMOS-CML circuit.

Moreover, the signal level of the output signal from the PMOS-CML amplifier 30 is substantially the same as the signal level of the output signal from the level converter 20. Furthermore, the attenuation of the signal in the period from T3 to T4 is not as large as the example shown in FIG. 5 but substantially the same as the amplitude in other period.

An example of FIG. 7 is waveforms of a signal communicated under a third condition where the frequency characteristic adjusting circuit 23 is connected. In the example of FIG. 6, a correction is made so that the amplitude of the output signal from the level converter 20 is maintained to be as constant as possible. However in the example of FIG. 7, a correction is made so that an amplitude in the period when a signal changes becomes larger than other period. By using the level converter 20 in the transmitting circuit 1, where the level converter 20 including the frequency characteristic adjusting circuit 23 that performs such correction, the transmitting circuit 1 can be used as a pre-emphasis circuit. The pre-emphasis circuit emphasizes rising edges of an output signal in order to prevents the change in the output signal from being smooth. The upper waveforms shown in FIG. 7 are waveforms of an input signal for the level converter 20 and middle waveforms are waveforms of an output signal for the level converter 20. Furthermore, the lower waveforms are waveforms of the output signal from the PMOS-CML amplifier 30.

As shown in FIG. 7, in this case the level converter 20 converts a signal level of the input signal from the NMOS-CML level to PMOS-CML level. At this time, an amplitude of the signal is reduced. An amplitude of the output signal from the level converter 20 is configured according to a ratio of the resistance values generated in the NMOS transistors that are connected in series and values of the resistances R1 and R2 in the frequency characteristic adjusting circuit 23. Furthermore, in the period from timing T1 to T5, the input signal changes as "0" "0" "1" "0". However, the level of the output signal in the period from timing T2 to T3 is smaller than other period. This is because that there is no level change of the input signal at timing T2 and the frequency of the output signal is reduced equivalently, thus a gain of the level converter 20 is low. On the other hand, the level of the output signal in the period from timing T3 to T4 is larger than in the timing from T2 to T3. This is because that the level of the input signal changes at timing T3 and the frequency of the input signal increases equivalently, thus the gain of the level converter 20 is high. That is, by the frequency characteristic adjusting circuit 23 emphasizing the frequency characteristic near the cutoff frequency of the output signal, the frequency characteristics of the transistors are corrected. More specifically, the frequency characteristic adjusting circuit 23 amplifies the amplitude near the cutoff frequency of the output signal by emphasizing the frequency characteristic near the cutoff frequency of the output signal from the level converter 20. Note that the degree of the correction is configured by the values of the resistances R1 and R2 and inductor L in the frequency characteristic adjusting circuit 23, diffusion layer capacities of the NMOS transistors N5 and N7 and gate capacities of the PMOS transistors P1 and P2 in the PMOS-CML circuit.

Furthermore, a signal level of an output signal from the PMOS-CML amplifier 30 is substantially the same as the signal level of the output signal from the level converter 20. Moreover, as with the output signal from the level converter 20, the amplitude of the signal in the period from timing T3 to T4 is larger than the amplitude in other period.

Figure 8:
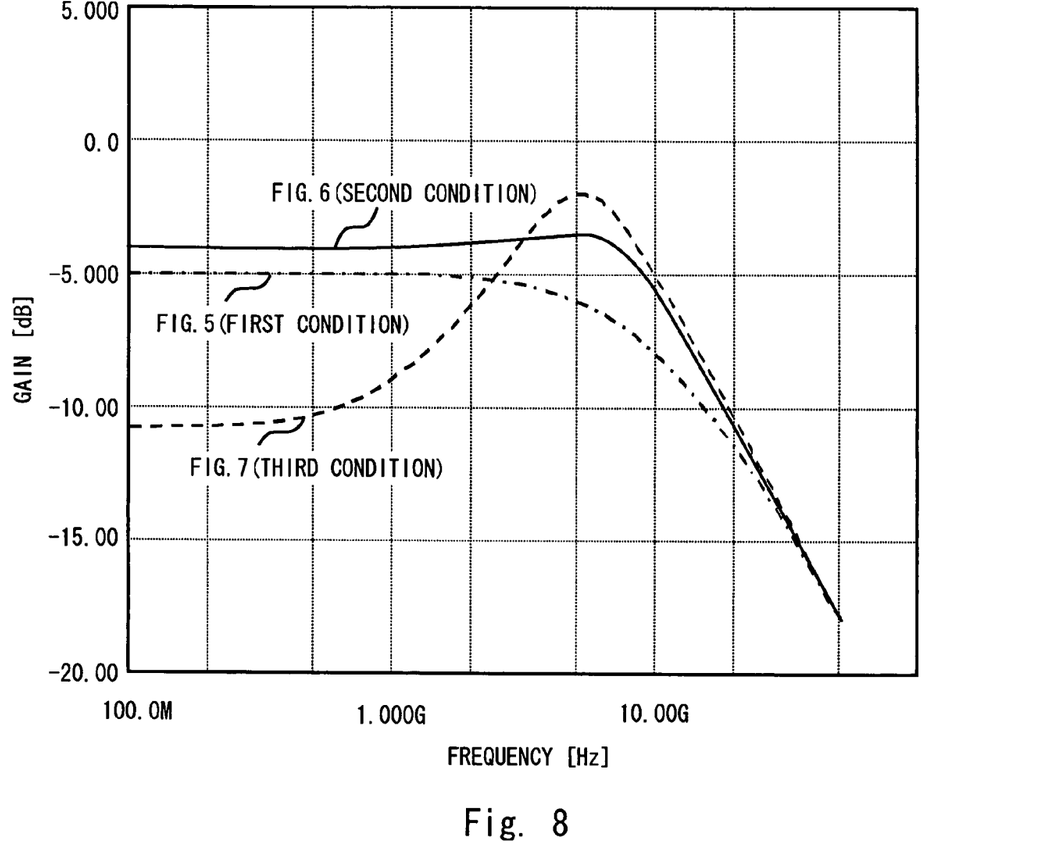
FIG. 8 shows a frequency characteristic of a level converter according to the first embodiment of the present invention.
Figure 9:
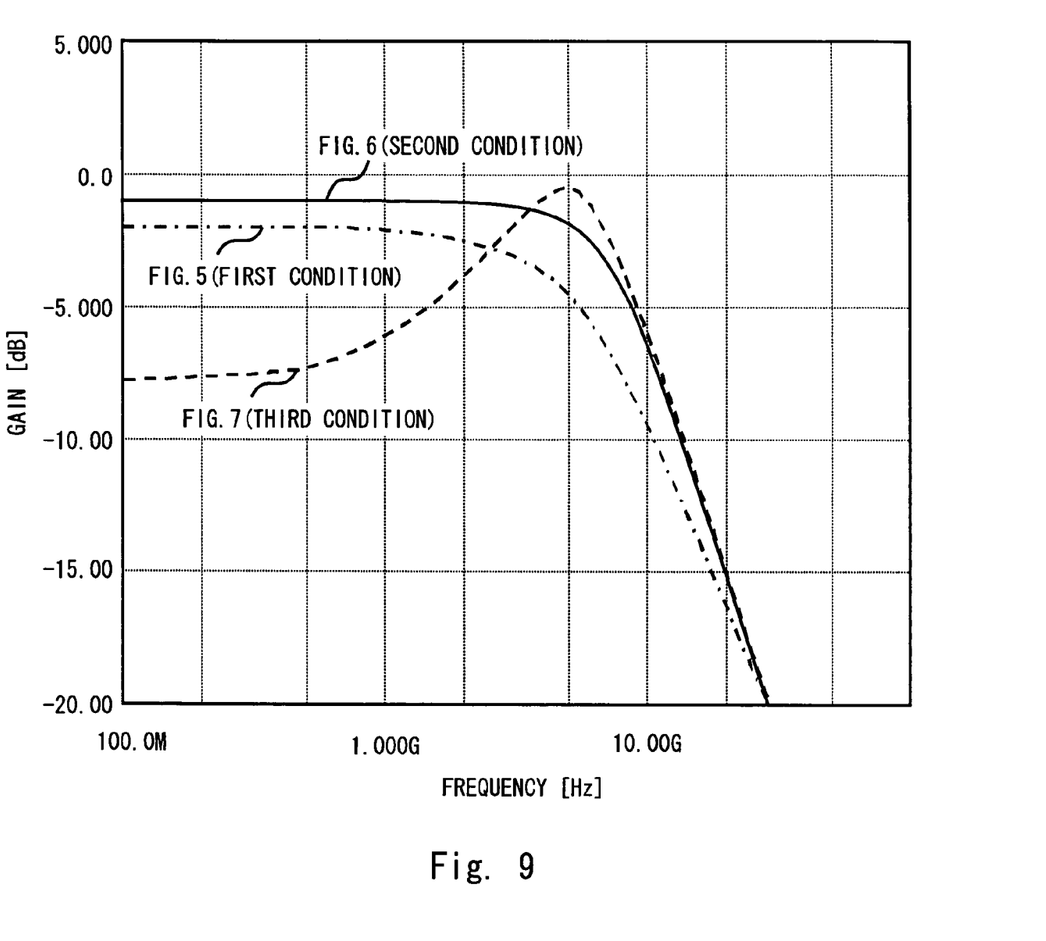
FIG. 9 shows a frequency characteristic from the level converter to the PMOS-CML amplifier according to the first embodiment of the present invention.

The frequency characteristics under the first to third conditions are described hereinafter in detail. FIGS. 8 and 9 are graphs of the frequency characteristics under each of the conditions. In the graph of FIG. 8, the horizontal axis (logarithmic axis) is a frequency of a signal and a vertical axis (linear axis) is a gain of an input/output signal of the level converter 20. As shown in FIG. 8, under the first condition, an attenuation of the gain starts from when the frequency of the signal is about 1.5 GHz and the frequency when the attenuation of the gain is −3 dB, it is approx. 6 GHz. That is, the cutoff frequency under the first condition is 6 GHz. Under the second condition, the gain slightly increases from when the frequency of the signal is about 2 GHz and the gain is attenuated from about 5 GHz. Specifically, under the second condition, the gain near the cutoff frequency under the first condition is slightly increased. Under the third condition, the gain increases from when the frequency of the signal is about 500 MHz, reaches its peak at about 5 GHz and after that the gain is attenuated. That is, under the third condition, the output signal is emphasized by increasing the gain near the cutoff frequency under the first condition.

In the graph of FIG. 9, the horizontal axis (logarithmic axis) is a frequency of a signal and a vertical axis (linear axis) is a gain of an output signal of the PMOS-CML amplifier 30 to an input signal of the level converter 20. As shown in FIG. 9, under the first condition, the attenuation of the gain starts from when the frequency of the signal is about 1 GHz and the frequency when the attenuation of the gain is −3 dB, it is approx. 4 GHz. That is, the cutoff frequency under the first condition is 4 GHz. Under the second condition, the attenuation of the gain starts from when the frequency of the signal is about 2 GHz and at about 6 GHz, the gain is −3 dB. That is, under the second condition, by slightly increasing the gain near the cutoff frequency under the first condition, the attenuation in the gain of the PMOS-CML amplifier 30 is corrected. Under the third condition, the gain increases from when the frequency of the signal is about 500 MHz, reaches its peak at about 5 GHz and after that the gain is attenuated. That is, under the third condition, the output signal is emphasized by increasing the gain near the cutoff frequency under the first condition.

From the above explanation, with the transmitting circuit 1 of this embodiment, a NMOS-CML level signal is converted into a PMOS-CML level signal by the level converter. Therefore, it is possible to reduce using the PMOS-CML amplifier 30 having poor frequency characteristic even when a PMOS-CML level signal must be output. More specifically, it is possible to communicate a signal while suppressing an attenuation in an amplitude of a high frequency PMOS-CML level signal.

Moreover, by connecting the frequency characteristic adjusting circuit 23 to the level converter 20, the frequency characteristic near the cutoff frequency of a signal to be communicated is emphasized. Thus the attenuation in the amplitude generated in the PMOS-CML amplifier 30 can be corrected. By further increasing the degree of the emphasis, the transmitting circuit 1 can be a pre-emphasis circuit.

On the other hand, the level converter 20 includes the first source follower 21 and second source follower 22 having current NMOS transistors N4 and N6 as current sources. The NMOS transistors N4 and N6 operate according to signals that drive the NMOS transistors N5 and N7, which are amplifier stages, and inverting signals. Thus an amplitude of a signal output from the level converter 20 can be configured according to a ratio between the resistances generated in the NMOS transistors N4 and N7 and a ratio between the resistances generated in the NMOS transistors N5 and N6. That is, by maintaining the ratio between the resistances generated in the transistors to be constant according to an amplitude of the output signal and reducing the sum of resistances generated in the transistor, the current flowing to the transistors increases. Thus, it is possible to increase the amplitude of the output signal while communicating a high frequency signal without attenuation. On the other hand, in the source follower driving the amplifier stages using the constant current source and resistances, when increasing the resistance value of the transistors in order to increase the amplitude, there is a problem that the amplitude of a high frequency signal is attenuated as the current flowing to the transistors decreases.

Second Embodiment

Figure 10:
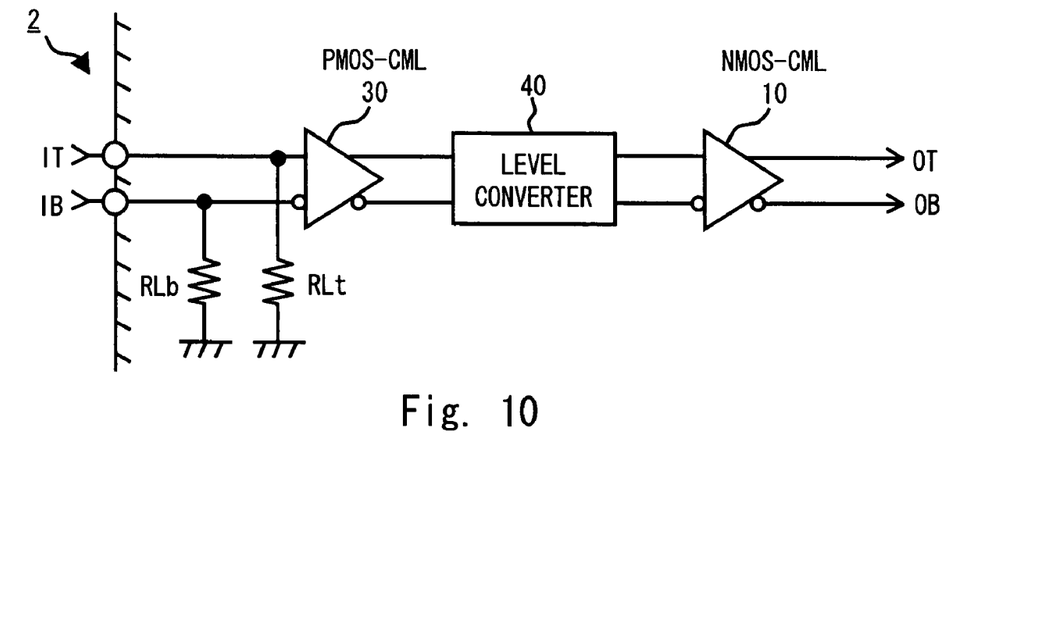
FIG. 10 is a block diagram of a transmitting circuit according to a second embodiment of the present invention.

A semiconductor device of a second embodiment forms a receiving circuit 2 using the NMOS-CML amplifier 10 and PMOS-CML amplifier 30 of the first embodiment. In the second embodiment, a level converter 40 for converting a PMOS-CML level signal into a NMOS-CML level signal is included.

FIG. 10 is a block diagram of the receiving circuit 2. The receiving circuit 2 according to the second embodiment is described hereinafter in detail with reference to FIG. 10. The receiving circuit 2 is a receiving unit for a signal input to the semiconductor device. As shown in FIG. 10, the receiving circuit 2 includes the NMOS-CML amplifier 10, the level converter 40 and the PMOS-CML amplifier 30. In the second embodiment, the PMOS-CML amplifier 30 is used as a first level converter, the NMOS-CML amplifier 10 is used as a second level converter and the level converter 40 is used as a third level converter. Note that in addition to the receiving circuit 2, the semiconductor device includes a circuit (not shown) for performing other signal processes. Furthermore, signal source resistances RLt and RLb are connected between an input of the PMOS-CML amplifier 30 and the ground voltage. These signal source resistances may be mounted inside or outside the semiconductor device. Furthermore, differential signals (OT and OB in FIG. 10) output from the receiving circuit 2 are transmitted to an internal circuit not shown.

Figure 11:
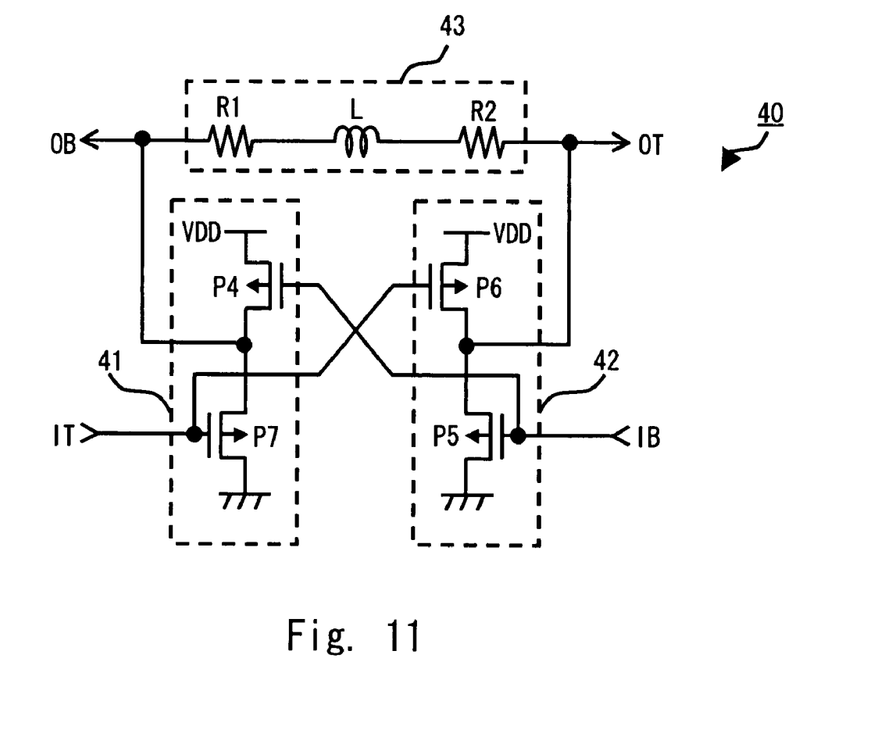
FIG. 11 is a circuit diagram of a level converter according to the second embodiment of the present invention.

In the receiving circuit 2, the level converter 40 is connected between the PMOS-CML amplifier 30 and NMOS-CML amplifier 10. Here, the PMOS-CML amplifier 30 and NMOS-CML amplifier 10 are identical to those in the first embodiment, thus the explanation is omitted. The level converter 40 is described hereinafter. The level converter 40 of this embodiment is composed of PMOS transistors so as to input a first differential signal (PMOS-CML level differential signal in the second embodiment) and output a second differential signal (NMOS-CML level differential signal in the second embodiment). The circuit diagram of the level converter 40 is shown in FIG. 11. As shown in FIG. 11, the level converter 40 includes a first source follower 41, second source follower 42 and frequency characteristic adjusting circuit 43.

The first source follower 41 includes a first transistor (for example a PMOS transistor P4) and fourth transistor (for example PMOS transistor P7). As for the PMOS transistor P4, a source is connected to a first power supply (power supply voltage in the second embodiment) and a drain is connected to a second output terminal. As for the PMOS transistor P7, a drain is connected to a second power supply (ground voltage in the second embodiment) and a source is connected to a second output terminal. To a gate of the PMOS transistor P4, one of the differential signal (for example the differential input signal IB) among the first differential signals is input. To a gate of the PMOS transistor P7, another differential signal (for example the differential input signal IT) among the first differential signals is input. One of the differential signal OB among the second differential signals is output from the second output terminal.

Moreover, the PMOS transistor P4 operates as a current source for the first source follower 41. On the other hand, the PMOS transistor P7 operates as an amplifier stage for the first source follower 41. An amplitude and signal level of the differential signal OB are configured according to a ratio between resistance values generated in the PMOS transistors P4 and P7. Furthermore, a current flowing to the PMOS transistor P7 is configured according to the power supply voltage and the sum of resistance values generated in the PMOS transistors N4 and P7. That is, by reducing the resistance values generated in the transistors, the amount of current flowing to the PMOS transistor P7 can be increased. At this time, a ratio of the resistance values generated in the PMOS transistors P4 and P7 is configured so that the amplitude of the differential signal OB becomes certain size.

The second source follower 42 includes a second transistor (for example PMOS transistor P5) and a third transistor (for example PMOS transistor P6). As for the PMOS transistor P6, a source is connected to the power supply voltage and a drain is connected to a first output terminal. As for the PMOS transistor P5, a drain is connected to the ground voltage and a source is connected to the first output terminal. To a gate of the PMOS transistor P5, the differential input signal IT among the first differential signal is input. To a gate of the PMOS transistor P6, the differential input signal TB among the first differential signal is input. Another differential signal OT among the second differential signal is output from the first output terminal.

Moreover, the PMOS transistor P6 operates as a current source for the second source follower 42. On the other hand, the PMOS transistor P5 operates as an amplifier stage for the second source follower 42. An amplitude and signal level of the differential signal OT are configured according to a ratio between resistance values generated in the PMOS transistors P5 and P6. Furthermore, a current flowing to the PMOS transistor P5 operating as the amplifier stage is configured according to the power supply voltage and the sum of resistance values generated in the PMOS transistors P5 and P6. That is, by reducing the resistance values generated in the transistors, the amount of current flowing to the PMOS transistor P5 can be increased. At this time, a ratio of the resistance values generated in the PMOS transistors P5 and P6 is configured so that the amplitude of the differential signal OT becomes certain size.

The frequency characteristic adjusting circuit 43 is connected between the first and the second output terminals. The frequency characteristic adjusting circuit 43 includes resistances R1 and R2 and an inductor L. In the example of FIG. 11, the resistances R1 and R2 are placed to the both ends of the inductor L and the resistances R1 and R2 and inductor L are connected in series. The frequency characteristic adjusting circuit 43 forms a filter by these resistances, inductor and drain and gate capacity of the transistors connected to the first and second output terminals so as to adjust frequency characteristic near a cutoff frequency of a signal to be communicated.

From the above explanation, the level converter 40 of the second embodiment corresponds to the level converter 20 of the first embodiment composed of PMOS transistors. That is, according to the level converter 40 of the second embodiment, it is possible to form a receiving circuit for a PMOS-CML level signal while reducing the number of the PMOS-CML amplifier 30. Furthermore, by using the level converter 40, it is possible to correct an amplitude that is attenuated near the cutoff frequency in the PMOS-CML amplifier 30. Note that when the frequency characteristic adjusting circuit 43 in the receiving circuit 2 has characteristics of the third condition in the first embodiment, the receiving circuit 2 can be used as an equalizing circuit.

The present invention is not limited to the above embodiments but may be modified and changed without departing from the scope and spirit of the invention. For example, the NMOS-CML amplifier 10 and PMOS-CML amplifier 30 are not limited to the illustrative example in the above embodiments but may have different circuit configuration.

What is claimed is:

1. A level converter, comprising:
   a first to fourth transistors formed of a semiconductor having a same conductivity type; and
   a resistance connected between first and second output terminals,
   wherein the first transistor is connected between a first power supply and the second output terminal,
   wherein the second transistor is connected between a second power supply and the first output terminal,
   wherein the third transistor is connected between the first power supply and the first output terminal,
   wherein the fourth transistor is connected between the second power supply and the second output terminal,
   wherein the first and the second transistors are input with one of first differential signals, and
   wherein the third and the fourth transistors are input with another of the first differential signals.

2. The level converter according to claim 1, further comprising an inductor connected between the first and the second output terminals.

3. The level converter according to claim 1, further comprising a resistance and an inductor connected between the first and the second output terminals.

4. The level converter according to claim 1, wherein the level converter outputs a second differential signal, the second differential signal being the first differential signal with signal level shifted.

5. The level converter according to claim 4, wherein the first and the second differential signals are CML level signals having a smaller amplitude than a potential difference between the first and second power supplies.

6. The level converter according to claim 4, wherein an amplitude and a signal level of the second differential signal output from the first output terminal is configured according to a ratio between resistance values generated in the second and the third transistors, and
wherein an amplitude and a signal level of the second differential signal output from the second output terminal is configured according to a ratio between resistance values generated in the first and the fourth transistors.

7. The level convener according to claim 1, wherein the second transistor comprises a source connected to a second power supply and a drain connected to a first output terminal.

8. The level convener according to claim 1, wherein the fourth transistor comprises a source connected to the second power supply and a drain connected to the second output terminal.

9. A level converter, comprising:
a first to fourth transistors formed of a semiconductor having a same conductivity type;
a resistance connected between the first and the second output terminals;
a first source follower including the first transistor having a source connected to a first power supply and a drain connected to the second output terminal and the fourth transistor having a drain connected to a second power supply and a source connected to the second output terminal; and
a second source follower including the third transistor having a source connected to the first power supply and a drain connected to the first output terminal and the second transistor having a drain connected to the second power supply and a source connected to the first output terminal,
wherein one of first differential signals is input to the first and the second transistors, and
wherein another of the first differential signals is input to the third and the fourth transistors.

10. The level convener according to claim 9, further comprising an inductor connected between the first and the second output terminals.

11. The level convener according to claim 9, further comprising a resistance and an inductor connected between the first and the second output terminals.

12. The level converter according to claim 9, wherein the level converter outputs a second differential signal, the second differential signal being the first differential signal with signal level shifted.

13. The level converter according to claim 12, wherein the first and the second differential signals are CML level signals having a smaller amplitude than a potential difference between the first and second power supplies.

14. The level converter according to claim 9, wherein the resistance comprises a first resistor and a second resistor, and
wherein an inductance is provided in series with the first resistor and the second resistor.

15. The level converter according to claim 9, further comprising a frequency characteristic adjusting circuit provided between the first and the second output terminals, the frequency characteristic adjusting circuit comprising an inductance.

16. The level converter according to claim 9, further comprising a frequency characteristic adjusting circuit provided between the first and the second output terminals, the frequency characteristic adjusting circuit comprising a resistance.

17. The level converter according to claim 9, wherein the first to fourth transistors comprise N-Channel Metal Oxide Semiconductor (NMOS) Transistors.

18. A semiconductor device, comprising:
a first level convener to convert a differential input signal into a first differential signal having a first signal level;
a second level converter to convert a differential input signal into a second differential signal having a second signal level; and
a third level convener to convert the first differential signal into the second differential signal,
wherein the third level converter is connected between the first level converter and the second level convener.

19. The semiconductor device according to claim 18, wherein the third level converter emphasizes a frequency component near a cutoff frequency of the first differential signal.

20. The semiconductor device according to claim 18, wherein the differential input signal and the first and the second differential signals have a smaller amplitude than a potential difference between a first and a second power supplies.

* * * * *